US009698739B2

(12) United States Patent
Young et al.

(10) Patent No.: US 9,698,739 B2
(45) Date of Patent: Jul. 4, 2017

(54) AUTOMATIC IMPEDANCE MATCHING USING TRUE POWER INFORMATION

(71) Applicant: Skyworks Solutions, Inc., Woburn, MA (US)

(72) Inventors: James Phillip Young, Cedar Rapids, IA (US); Joel Anthony Penticoff, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/869,041

(22) Filed: Sep. 29, 2015

(65) Prior Publication Data
US 2016/0094190 A1  Mar. 31, 2016

Related U.S. Application Data

(60) Provisional application No. 62/057,451, filed on Sep. 30, 2014.

(51) Int. Cl.
| | | |
|---|---|---|
| *H03F 3/191* | (2006.01) | |
| *H03F 3/19* | (2006.01) | |
| *H03H 7/40* | (2006.01) | |
| *H03F 1/02* | (2006.01) | |
| *H03F 1/56* | (2006.01) | |
| *H03F 3/24* | (2006.01) | |

(52) U.S. Cl.
CPC ............ *H03F 3/19* (2013.01); *H03F 1/0205* (2013.01); *H03F 1/565* (2013.01); *H03F 3/245* (2013.01); *H03H 7/40* (2013.01); *H03F 2200/207* (2013.01); *H03F 2200/378* (2013.01); *H03F 2200/387* (2013.01); *H03F 2200/451* (2013.01)

(58) Field of Classification Search
CPC . H03F 3/52; H03F 3/191; H03F 3/193; H03F 1/52
USPC ....................................... 330/207 P, 298, 305
See application file for complete search history.

(56) References Cited

U.S. PATENT DOCUMENTS

| 7,408,413 B2 | 8/2008 | Ripley | |
|---|---|---|---|
| 8,294,514 B2 * | 10/2012 | Visser | ........................ H03F 1/56 330/2 |
| 2008/0030279 A1 * | 2/2008 | Ojo | ........................... H03F 1/42 330/305 |

* cited by examiner

*Primary Examiner* — Steven J Mottola
(74) *Attorney, Agent, or Firm* — Knobbe, Martens, Olson & Bear, LLP

(57) ABSTRACT

Aspects of this disclosure relate to systems and methods of performing dynamic impedance tuning. Certain aspects may be performed by or include a dynamic impedance matching network. The dynamic impedance matching network can determine a desired output power for a power amplifier, true power information for the power amplifier, and an output power delivered to a load by the power amplifier. In addition, the dynamic impedance matching network can determine whether the output power satisfies the true power information. Responsive to this determination, the dynamic impedance matching network may modify a load line impedance for the power amplifier using an impedance tuning network.

20 Claims, 8 Drawing Sheets

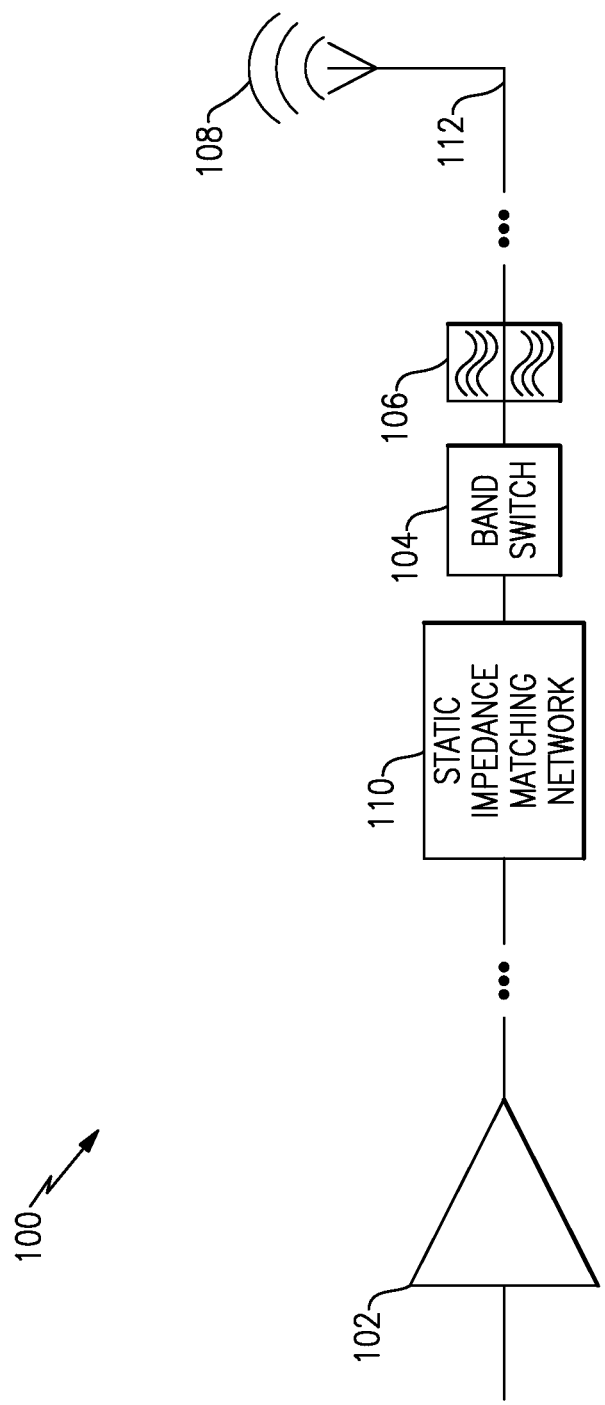

Figure 2A:
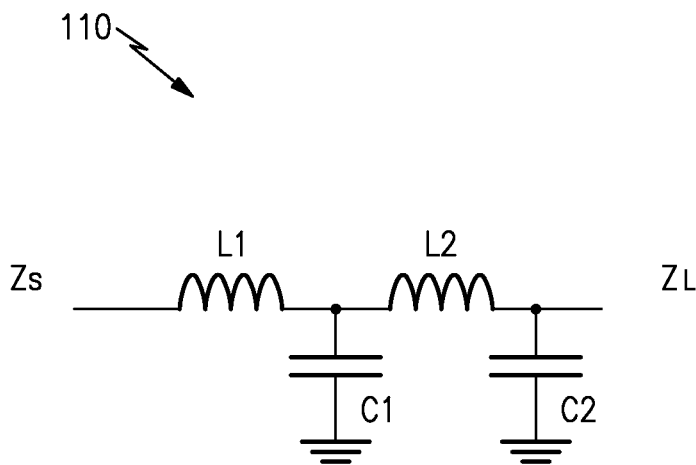

AUTOMATIC IMPEDANCE MATCHING USING TRUE POWER INFORMATION

RELATED APPLICATIONS

This disclosure claims priority to U.S. Provisional Application No. 62/057,451, which was filed on Sep. 30, 2014 and is titled "AUTOMATIC IMPEDANCE MATCHING USING TRUE POWER INFORMATION," the disclosure of which is expressly incorporated by reference herein in its entirety.

BACKGROUND

Technical Field

This disclosure relates to impedance matching and, in particular, to automatic impedance matching using true power information.

Description of Related Technology

Electronic devices are typically made from a plurality of electric and/or electronic components. Often, these device components will transfer signals with a particular amount of power between each other. Typically, the device components will each be associated with a particular impedance. This impedance can impact a signal or a power level of a signal.

To maximize power transfer, it is usually desirable for device components that are in direct electrical communication to have the same impedance at the interface between the components. In other words, it is usually desirable for a first component receiving a signal to have the same impedance at the input as a second component providing the signal to the first component has at its output. Thus, device components that are directly electrically connected are often designed to have the same impedance value between the device components.

However, in some cases, it is not possible to design two device components with the same impedance. In some such cases, an impedance matching component or circuit may be designed to match the impedance between two electrically connected device components. This impedance matching component may be inserted between the two electrically connected device components to match the impedance of the two device components. The impedance matching component can be effective in cases where the impedance of the two device components is static. However, in some cases, an impedance of a device component may not be static, but may be dynamic. In such cases, the impedance matching component may not be effective in some cases.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIG. 1 illustrates an example of a portion of an electronic device that includes a static impedance matching network.

FIG. 2A illustrates an example of a static impedance matching network.

FIG. 2B presents a graph of output power versus efficiency for an example power amplifier.

FIG. 3 illustrates an example of a dynamic impedance matching network.

FIG. 4 illustrates an example of a dynamic impedance matching network using a single coupler and detector pair.

FIG. 5A illustrates an example of a Smith chart of power amplifier efficiency for a variety of load line impedances against measured power output values for a 2G power amplifier.

FIG. 5B illustrates an example of a Smith chart that can be used to visualize the impedance values of the load line.

FIG. 6 presents a flowchart of an embodiment of an automatic impedance tuning process.

FIG. 7 illustrates a block diagram of a wireless device including a power amplifier module.

SUMMARY

One aspect of this disclosure relates to a method of performing dynamic impedance tuning. In some cases, the method may be performed by a dynamic impedance matching network. The method may include determining a desired output power for a power amplifier. Further, the method may include determining true power information for the power amplifier and measuring an output power delivered to a load by the power amplifier. In addition, the method may include determining whether the output power satisfies the true power information. Responsive to determining that the output power does not satisfy the true power information, the method may include modifying a load line impedance for the power amplifier using an impedance tuning network.

In some cases, the true power information includes a collector current provided to the power amplifier, a collector voltage applied to the power amplifier, and an efficiency value for the power amplifier. The true power information may be used to calculate the true power for the power amplifier by, for example, multiplying the efficiency value by a power value determined from the collector current and the collector voltage. Moreover, determining whether the output power satisfies the true power information can include determining whether the output power is within a threshold value of the true power information.

In some implementations, the method may include setting an initial load line impedance for the power amplifier using the impedance tuning network. Setting the initial load line impedance can include selecting an intermediate impedance value for the power amplifier. Further, modifying the load line impedance can include closing a set of switches included in the impedance tuning network causing a set of capacitors to be placed in electrical communication with the power amplifier. Responsive to determining that the output power does not satisfy the true power information, the method may further include determining whether the load line impedance should be increased or decreased.

Another aspect of the present disclosure relates to a dynamic impedance matching network. The dynamic impedance matching network may include an impedance tuning network that can include an inductor, a first set of capacitors in electrical communication with a first node of the inductor, a second set of capacitors in electrical communication with a second node of the inductor, a first set of switches between the first set of capacitors and a ground, and a second set of switches between the second set of capacitors and the ground. Further, the dynamic impedance matching network can include a coupler in electrical communication with a first node of the impedance tuning network. In addition, the dynamic impedance matching network may include a detector in electrical communication with the coupler. The combination of the detector and the coupler can be configured to measure a first power value at the first node of the impedance tuning network. Moreover, the dynamic impedance matching network may include an automatic impedance tuner electrically coupled to the detector and configured to operate the first and second sets of switches based at least in part on the first power value.

In some embodiments, the impedance tuning network may include a second node in electrical communication with a power amplifier. This second node may be directly coupled to the power amplifier. In some cases, the automatic impedance tuner is further configured to obtain true power information for the power amplifier. Moreover, the automatic impedance tuner may be further configured to operate the first set of switches and the second set of switches based at least in part on a result of comparing the first power value with the true power information. In some cases, the true power information includes an input power applied to the power amplifier and a gain efficiency for the power amplifier. Further, the input power may be a collector input power applied to a collector of the power amplifier.

In some designs, the automatic impedance tuner can include a capacitor controller configured to operate the first set of switches and the second set of switches. Moreover, the automatic impedance tuner can include an optimization state machine configured to specify switches from the first set of switches and switches from the second set of switches to operate based at least in part on the first power value.

Yet another aspect of the present disclosure relates to a wireless device. The wireless device can include a power amplifier module that may include a power amplifier. Further, the wireless device can include an impedance matching network that may include an impedance tuning network, a coupler, a detector, and an automatic impedance tuner. The impedance tuning network may include an inductor, a first set of capacitors in electrical communication with a first node of the inductor, a second set of capacitors in electrical communication with a second node of the inductor, a first set of switches between the first set of capacitors and a ground, and a second set of switches between the second set of capacitors and the ground. The coupler may be in electrical communication with a first node of the impedance tuning network. Further, the combination of the detector and the coupler may be configured to measure a first power value at the first node of the impedance tuning network. In addition, the automatic impedance tuner may be in electrical communication with the detector and may be configured to operate the first and second sets of switches based at least in part on the first power value.

In some embodiments, the impedance tuning network includes a second node in electrical communication with the power amplifier. Further, the automatic impedance tuner may be further configured to obtain true power information for the power amplifier. In addition, the automatic impedance tuner may be further configured to operate the first and second sets of switches based at least in part on a result of comparing the first power value with the true power information. In some implementations, the automatic impedance tuner includes a capacitor controller configured to operate the first set of switches and the second set of switches.

DETAILED DESCRIPTION

Typically, it is desirable to match impedances between devices or circuit elements within an electronic device. These devices are not limited in type and may include power amplifiers, switches, transceivers, antennas, etc. Often, 50 Ohms is selected as the matching impedance. In other words, circuit elements are designed with the assumption that the input to the elements will be at 50 Ohms. However, it is often the case that circuit elements will produce or function at impedance values other than 50 Ohms, or the selected matching impedance value.

For example, wireless device physical environments can change causing mismatch problems at the antenna. These environmental changes can include how a phone is held by the user or a shape change of the phone as may occur, for example, when a flip phone is unfolded or a keyboard is slid out of the phone. These events may cause an antenna mismatch, which in turn can create a mismatch for the power amplifier driving the antenna. This mismatch impedance shifts the load line impedance for the power amplifier. Since the maximum output power of the amplifier is often determined by the load impedance, this change in load impedance can change the maximum output power that the amplifier is capable of delivering to the load. The output power of the power amplifier may be described as a function of the load line impedance as illustrated by equation 1.

$$Rl = \frac{Vcc^2}{2 \times Pout} \qquad (1)$$

In equation 1, Rl may refer to the amplifier load line or the collector load impedance of the amplifier. Vcc refers to the power supply voltage or the battery voltage and Pout may refer to the maximum output power of the power amplifier.

To account for the difference in impedance between circuit elements, often an impedance matching network will be included within a signal path. This impedance matching network will raise or lower the impedance at an output of a first circuit element so that the impedance at the input to a second circuit element is 50 Ohms. Usually, the impedance matching network is a static network designed specifically for a particular application (e.g., to match the impedance between a power amplifier and an antenna to 50 Ohms).

FIG. 1 illustrates an example of a portion of an electronic device 100 that includes a static impedance matching network 110. Electronic device 100 may include a power amplifier 102, which may be part of a power amplifier module, a static impedance matching network 110, a band switch 104, a duplexer 106, and an antenna 108. Further, additional devices may be located along the load line 112 as illustrated by the ellipses between the power amplifier 102 and the static impedance matching network 110 and in between the duplexer 106 and the antenna 108. The static impedance matching network 110 may be configured so that devices along the load line 112 may be configured assuming a particular impedance along the load line 112 (e.g., 50 Ohms).

Although the static impedance matching network 110 may match the impedance between the power amplifier 102 and the antenna 108, often an impedance mismatch will occur along the load line 112 due, for example, to impedance changes at the antenna 108. These impedance changes may occur due to the environment in which the electronic device 100 operates in the way in which users handle the electronic device 100. For instance, the impedance of the antenna 108 may change based on how close a user's hand is to the antenna 108. As a second example, the impedance of the antenna 108 may change due to a change in shape of the electronic device 100 (e.g., a keyboard is slid out from beneath the screen of the electronic device 100). Thus, despite the inclusion of a static impedance matching network 110, there may be an impedance mismatch between devices along the load line 112.

FIG. 2A illustrates an example of the static impedance matching network 110. As illustrated in FIG. 2A, the static impedance matching network 110 may be formed from a series of LC circuits. For example, the static impedance matching network 110 of FIG. 2A includes two LC circuits, L1C1 in series with L2C2. This pair of LC circuits transforms the impedance ZS at the input of the static impedance matching network 110 to a different impedance value ZL at the output of the static impedance matching network 110. For example, the impedance ZS may be transformed from 4 ohms to 50 ohms at the output with the impedance ZL. However, as stated above, changes to impedances subsequent to the output of the static impedance matching network 110 may result in ZL having an impedance other than 50 ohms.

Figure 2B:
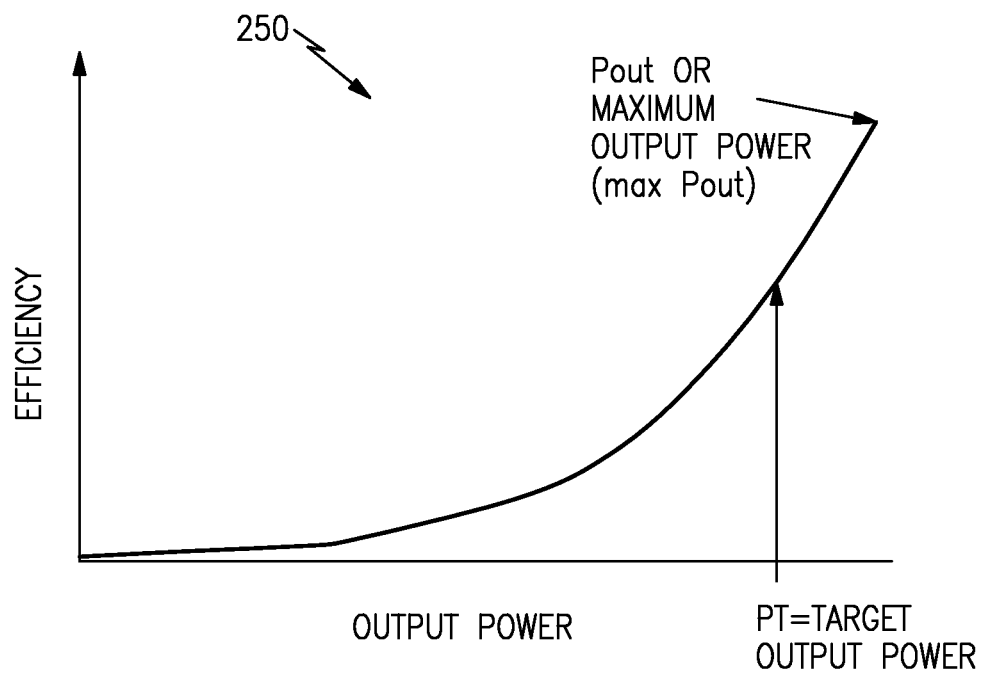

FIG. 2B presents a graph 250 of output power versus efficiency for an example power amplifier. The top right of the curve represents the maximum output power as defined by equation 1 above. In an example cell phone application, the base station may request the phone to transmit a signal at a specified or target output power Pt. The lower Pt is from Pout, or the maximum output power of the amplifier, the lower the efficiency of the device. In cases where the antenna impedance changes and causes the collector impedance RI to drop, the maximum Pout may increase and the Pt will be lower on the curve of the graph 250, which can cause the efficiency to drop. This drop in efficiency may lower the battery life of the cell phone, or other wireless device. On the other hand, in cases where RI increases, the Pout may drop and the phone may not be able to reach Pt, which can cause a call to be dropped.

Thus, embodiments of the disclosure herein maximize the efficiency of the power amplifier while maintaining Pt. This may be accomplished by adjusting a load line impedance back to its original designed value, thereby maintaining the maximum Pout, or by lowering the load line impedance, thereby increasing the efficiency of the power amplifier while maintaining Pt. Adjusting the impedance of the load line can be accomplished by, for example, changing C1 and C2 in FIG. 2A or by adding a tunable network like that described below with respect to FIGS. 3 and 4.

Example Dynamic Impedance Matching Network

Figure 3:
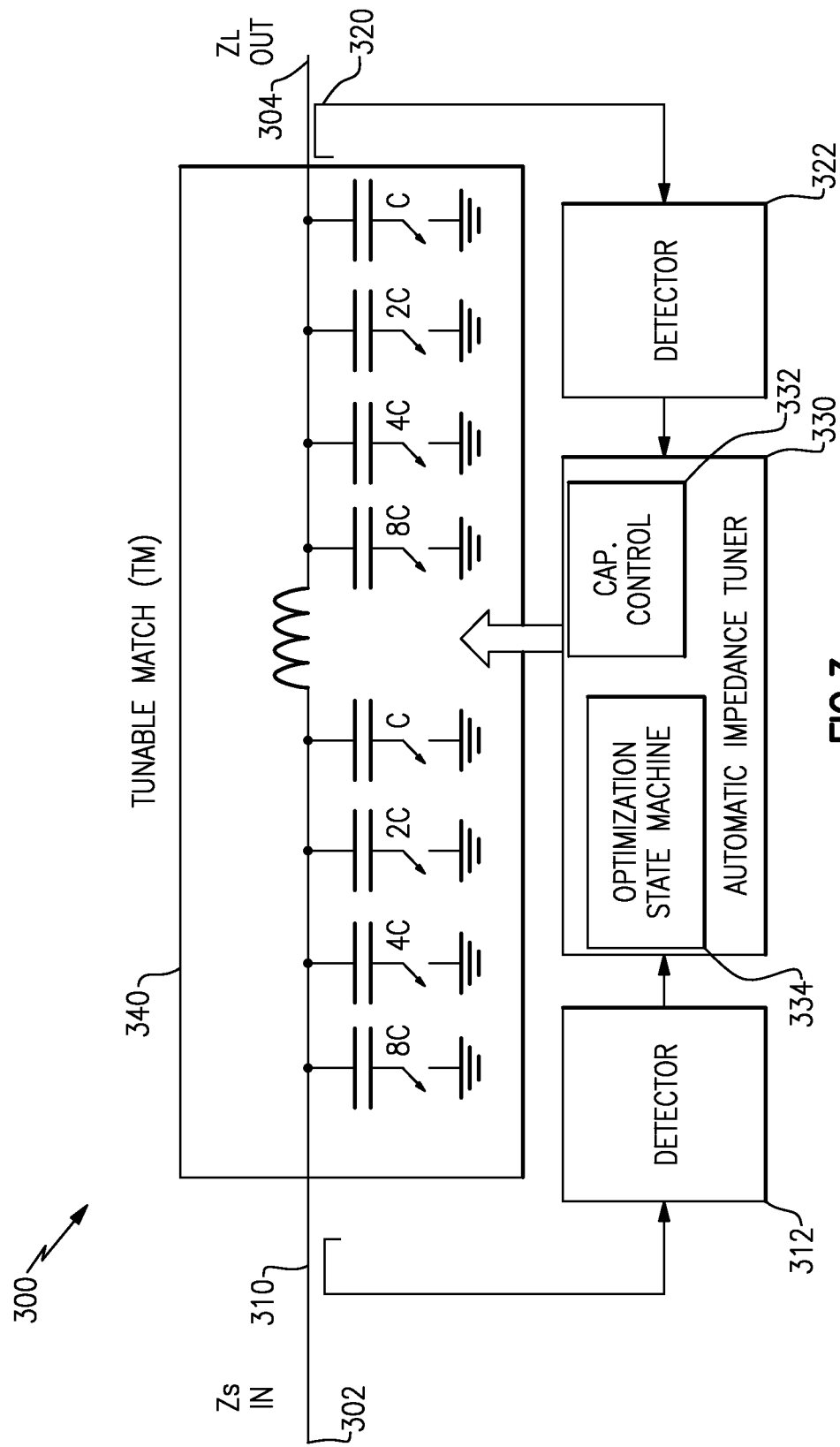

FIG. 3 illustrates an example of a dynamic impedance matching network 300. The dynamic impedance matching network 300 can perform adaptive impedance matching between a power amplifier in electrical communication with the dynamic impedance matching network 300 at a node 302 and an antenna in electrical communication with the dynamic impedance matching network 300 at a node 304. It should be understood that, in some cases, there may exist one or more circuit elements between the dynamic impedance matching network 300 and one or both of the power amplifier and the antenna.

Using the static impedance matching network 110, the efficiency and the linearity of the impedance match changes when the antenna impedance changes. However, using the dynamic impedance matching network 300, the impedance of the load line may be adaptively modified when the load impedance of the antenna changes.

To accomplish the dynamic impedance matching, the dynamic impedance matching network 300 measures the forward power and the reflected power along the load line that includes the power amplifier and the antenna. Using the forward power and the reflected power measurements, the dynamic impedance matching network 300 can determine that the antenna is mistuned and can retune the impedance and compensate for the antenna mismatch.

As illustrated in FIG. 3, the dynamic impedance matching network 300 includes a pair of coupler/detector pairs. The coupler 310 and detector 312 measures the forward or incident power received at the node 302 from the power amplifier as illustrated by the coupler termination being positioned on the right. The coupler 320 and detector 322 measure the reflected or reverse power at the node 304 as illustrated by the coupler termination being positioned on the left. Using the measured forward power and reflected power, an automatic impedance tuner 330 can adjust the impedance of the load line that includes the dynamic impedance matching network 300 to match a particular impedance value, which is typically, although not necessarily, 50 Ohms.

The dynamic impedance matching network 300 can include a configurable impedance tuning network 340. The impedance tuning network 340 may include a set of capacitors in electrical communication with an inductor as illustrated in FIG. 3. Further, as illustrated in FIG. 3, the capacitors can each be some multiple of a particular capacitance value. Thus, a capacitor controller 332 can control a series of switches in the impedance tuning network 340 to electrically connect one or more of the capacitors between the inductor and ground while the switches of the remaining capacitors may remain open. By electrically connecting different capacitance values with the inductor, an LC circuit can be created that modifies the impedance of the load line in an attempt to match the impedance at the node 302 (e.g., ZS In) with the impedance at the node 304 (e.g., ZL Out).

The automatic impedance tuner 330 may further include an optimization state machine 334 that may be used to determine which switches of the impedance tuning network 340 to open or close to modify the impedance of the load line. The optimization state machine 334 may instruct the capacitor controller 332 as to which switches to open and close. The automatic impedance tuner 330 may receive new forward power and reflected power measurements from the detectors 312 and 322, respectively, after a change is made to the state of the switches in the impedance tuning network 340. Based on the new forward power and reflected power measurements, the optimization state machine 334 may cause the capacitor controller 332 to further modify the state of the switches in the impedance tuning network 340. In some embodiments, this process of measuring the forward power and reflected power and modifying the impedance of the load line by adjusting the state of the switches of the impedance tuning network 340 may be repeated on an iterative basis until the impedance of the load line matches 50 Ohms, or a desired impedance value.

Figure 4:
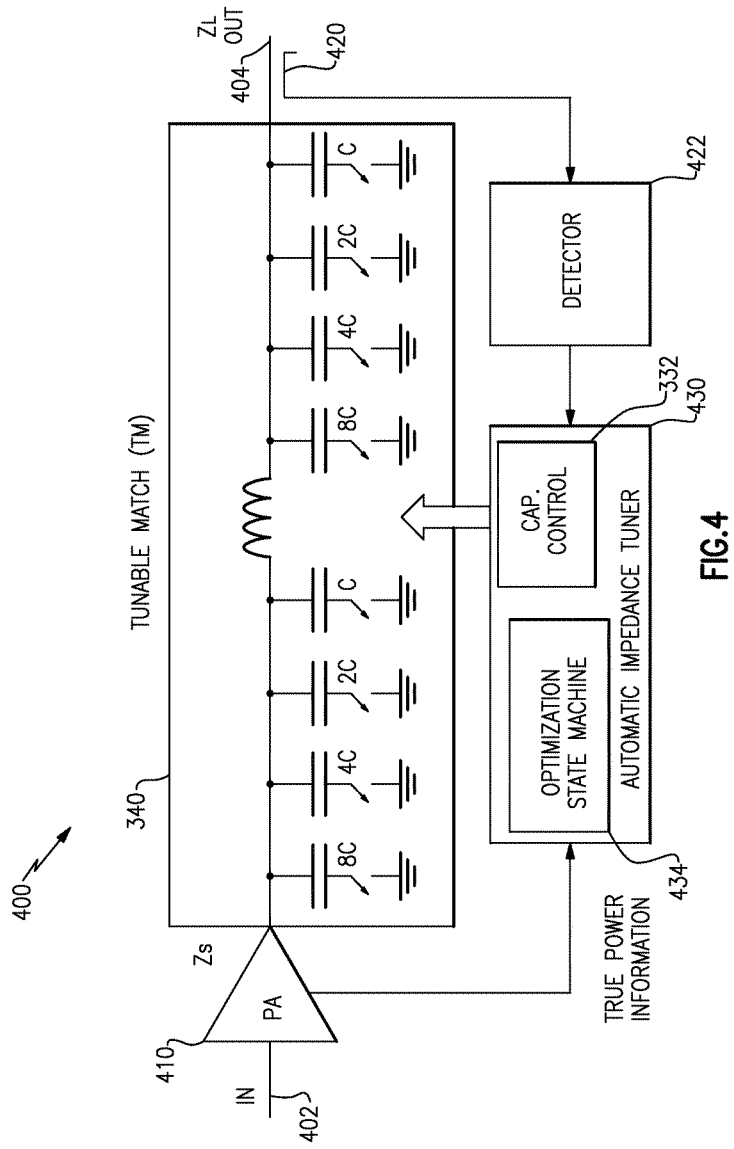

As electronic devices are made smaller and as additional device features are added to devices, the amount of space allocated to different features shrinks. Further, there is more pressure to extend battery life and to reduce the amount of power available to operate difference components. Thus, there is an incentive to reduce the number of components included in an electronic device to perform a function. This includes reducing the footprint of the dynamic impedance matching network. As illustrated in FIG. 4, and described below, it is possible to implement the dynamic impedance matching network using one coupler and detector pair instead of two by modifying the location of the dynamic impedance matching network on the load line and using true power information to facilitate configuring the impedance tuning network.

Example Dynamic Impedance Matching Network Using One Coupler/Detector Pair

FIG. 4 illustrates an example of a dynamic impedance matching network 400 using a single coupler 420 and detector 422 pair. Advantageously, as mentioned above, the dynamic impedance matching network 400 reduces the number of couplers and detectors from two to one, respectively, compared to the dynamic impedance matching network 300. While the dynamic impedance matching network 300 may generally be located anywhere on the load line between the power amplifier and the antenna, the dynamic impedance matching network 400 is typically located immediately adjacent to the power amplifier 410.

Advantageously, in certain embodiments, by locating the dynamic impedance matching network 400 adjacent to the power amplifier 410, the dynamic impedance matching network 400 can obtain, using the automatic impedance tuner 430, the true power information of the power amplifier (PA) 410. The true power information may include a measure of the voltage and the current entering the collector of the power amplifier transistor. In some embodiments, the PA 410 may be part of a power amplifier module (PAM) that includes a power control circuit. The PA 410 may be electrically coupled to the power control circuit and the PA 410 may draw a supply current and receive a supply voltage from the power control circuit. For example, the supply voltage may be a collector voltage of the power amplifier 410 and the supply current may be a collector current of the power amplifier 410. The power control circuit may be configured to control a DC power provided to the power amplifier 410 by controlling a product of a sense current and the supply voltage. The sense current may be a mirror current of the supply current. The automatic impedance tuner 430 may receive the product of the sense current and the supply voltage. This product may be considered a representation of the "true power" of the PA 410. In certain embodiments, by multiplying the true power by the efficiency of the PA 410, the PA 410 output power can be determined. This output power may be considered the forward power of the PA 410. Thus, using the true power information, the automatic impedance tuner 430 can calculate the expected power output from the PA 410. In certain embodiments, the PA 410 may be a multistage power amplifier and may include multiple transistors. In some such embodiments, the true power information is determined for the output stage or the output transistor of the PA 410. Further, in some cases, at least some of the transistors of the PA 410 are configured as common emitter or common source transistors.

In some embodiments, the automatic impedance tuner 430 can measure the true power information using one or more of the embodiments disclosed in U.S. application Ser. No. 11/899,925 filed on Sep. 7, 2007 (now U.S. Pat. No. 7,408,413) and titled "CIRCUIT FOR ACCURATELY CONTROLLING POWER AMPLIFIER OUTPUT POWER," which is hereby incorporated by reference in its entirety.

The coupler 420 and the detector 422 may be used to measure the output power of the PA 410 at the node 404. This measured output power may be the forward power of the PA 410 as illustrated by the termination for the coupler being positioned on the right of the coupler 420, which may differ from the position of the termination for the coupler 320 of FIG. 3. In certain embodiments, the coupler 420 is a dual directional coupler capable of measuring both the forward power and the reverse or reflected power of the PA 410. In some such cases, a controller may cause a switch to adjust which port of the coupler 420 is terminated and which port is being measured enabling the detector 422 to determine the forward power and/or the reflected power of the PA 410.

The automatic impedance tuner 430 can use the true power information and the expected efficiency of the PA 410 to calculate an expected power output. This calculation can be determined by multiplying the collector voltage, the collector current, and the power amplifier efficiency. Further, this expected power output can be compared against the power output measured by the combination of the coupler 420 and the detector 422. If the measured power output does not match the expected power output, the automatic impedance tuner 430 can determine that an impedance mismatch exists on the load line that includes the power amplifier 410 and can optimize or modify the impedance tuning network 340 to try and match the measured power output to the expected power output. Generally, if the measured output power is less than the expected output power, the impedance across the load line is too high. If the measured output power is higher than the expected output power, it is likely that the impedance across the load line too low. In either case, the automatic impedance tuner can modify the impedance by adjusting the impedance tuning network 340.

In certain embodiments, the automatic impedance tuner 430 may adjust the impedance tuning network 340 until the measured power output satisfies the expected power output. Then, while maintaining the desired power output, the automatic impedance tuner 430 can further modify the impedance tuning network 340 to minimize or reduce the power consumption of the PA 410 to below a threshold. Advantageously, in certain embodiments, by modifying the impedance using the impedance tuning network 340 to both obtain a desired power output and to reduce power consumption of the PA 410, the efficiency of the PA can be improved compared to solutions that perform impedance matching without performing a power consumption reduction process for the PA 410.

Figure 5A:
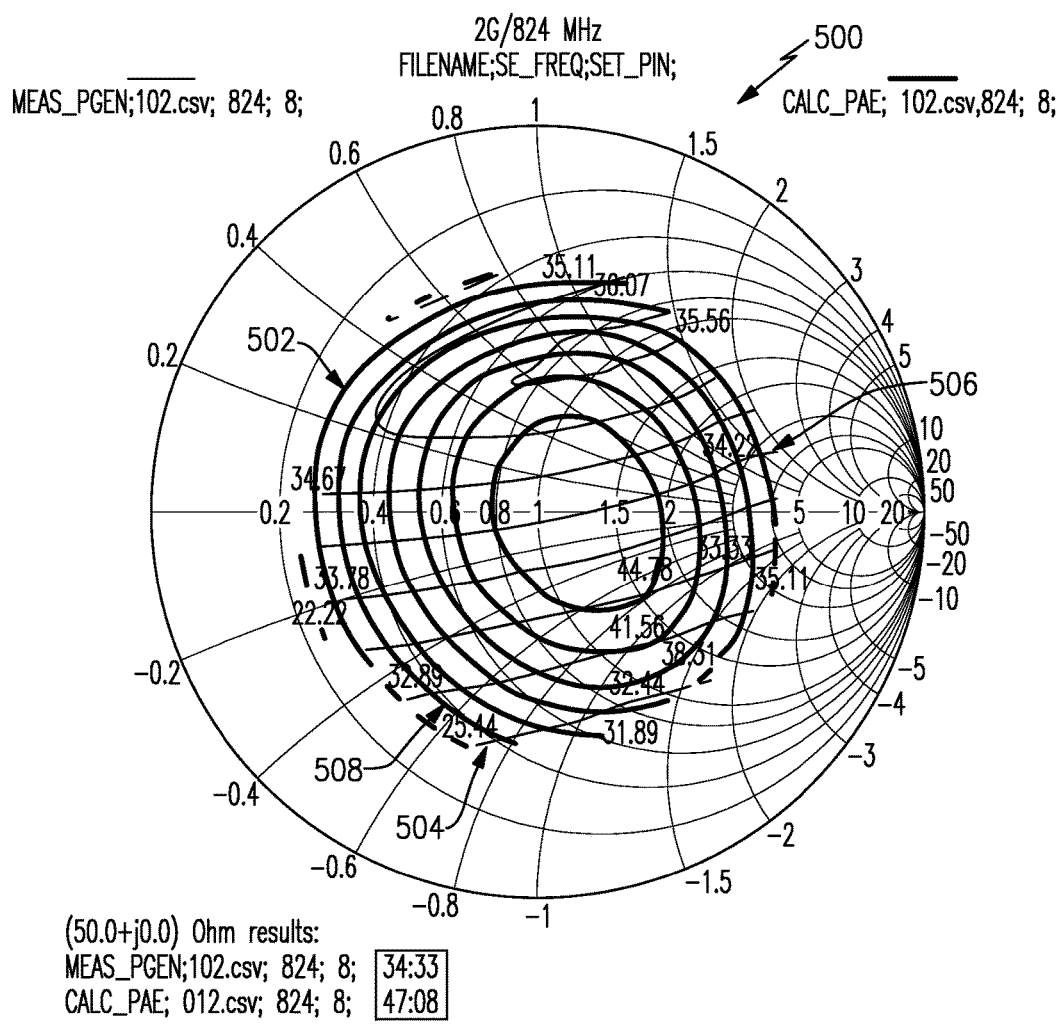

FIG. 5A illustrates an example of a Smith chart 500 of power amplifier efficiency for a variety of load line impedances against measured power output values for a 2G power amplifier. The power amplifier efficiency is represented by the lines 502, which are the thicker lines and is illustrated for various load line impedances, which may correspond to adjustments to the impedance tuning network 340. The measured power output is represented by the lines 504, which are the thinner lines and may correspond to the power measured from the coupler 420.

As illustrated by the Smith chart 500, for a constant output power at 34.22 dBm, represented by line 506, the PA efficiency can be varied from about 25% (represented by the line 508) to 47%, which is the approximate efficiency in the center of the Smith chart 500, which represents the 50 Ohm point normalized to 1. Thus, in certain embodiments, the relationship between the forward power measured at the coupler 420 versus the true power can be set to a fixed efficiency. Alternatively, in certain embodiments, the power amplifier efficiency can be improved by attempting to minimize the true power measured while holding the output power at a target value.

As with the automatic impedance tuner 330, the automatic impedance tuner 430 may include a capacitor controller 332, which may open or close one or more switches of the impedance tuning network 340 to modify the impedance between the PA 410 and the circuit elements (e.g., an antenna) in electrical communication with the node 404. The automatic impedance tuner 430 may include an optimization state machine 434 that can determine whether there is an impedance mismatch on the load line. Further, the optimization state machine 434 can cause the capacitor controller 332 to reduce or increase the impedance generated by the automatic impedance tuner 430 in an attempt to match the impedance between the PA 410 and subsequent elements on the load line.

For a power amplifier in a wireless device that is using a battery voltage of 3.4V for the transistor of the PA, the Zs is typically set between 2 and 4 Ohms depending on the required PA output power. Further, in many such cases the impedance of the antenna is designed to be 50 Ohms. Thus, the impedance matching element of the load line is often designed to match the 2-4 Ohms to 50 Ohms. However, as previously stated, the impedance on the load line may change for a number of reasons, such as the position of a user's hand to the antenna of the electronic device (e.g., cell phone). Thus, the impedance tuning network 340 can be reconfigured to keep the impedance at approximately 50 Ohms, or the application-specific impedance value.

The automatic impedance tuner 430 can adjust the impedance tuning network 340 until the output power matches the expected output power for the supplied true power information. In other words, the impedance tuning network 340 is adjusted until the output power measured by the node 404 matches the input power times the efficiency for the PA 410.

Figure 5B:
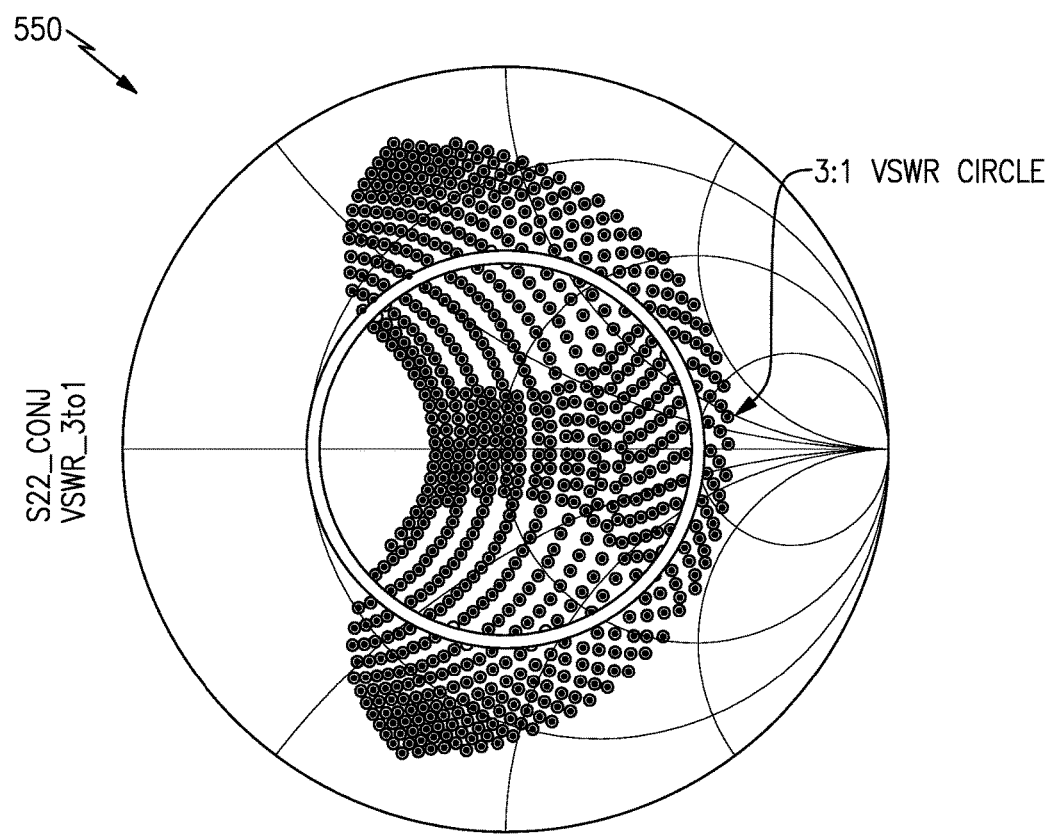

FIG. 5B illustrates an example of a Smith chart 550 that can be used to visualize the impedance values of the load line at, for example, the output of the PA 410 or the node 404. The center of the Smith chart 550 can be between 2 and 4 Ohms when used to represent the output impedance of the PA 410 or at the designed impedance for the antenna (e.g., 50 Ohms) when used to represent the impedance at the node 404. As the switches are opened or closed in the impedance tuning network 340, the impedance is modified.

Assuming the center of the Smith chart is at 4 Ohms, as the impedance of the antenna changes, the impedance as viewed by the PA 410 changes and moves to one of the points represented by the dots on the Smith chart 550. The automatic impedance tuner 430 modifies the impedance by connecting different capacitors on the right and left of the inductor in the impedance tuning network 430 so that the PA 410 continues to see 50 Ohms at the antenna and the Smith chart moves back toward the center.

Generally, the process of matching the impedance is an iterative process. For instance, assume that the automatic impedance tuner 430 determines that the output power is greater than the expected power. The capacitor controller 332 may close one or more switches on the right of the inductor and/or one or more switches on the left of the inductor of the impedance tuning network 340 to electrically connect the corresponding capacitors to the load line. After the impedance tuning network 340 has been configured or reconfigured, the automatic impedance tuner 430 can determine whether the expected output power matches the measured output power. If it does not, the automatic impedance tuner may reconfigure the switches of the impedance tuning network 340. The decision of which switches to open or close may be based on whether the expected output power is closer to the measured output power compared to the previous comparison.

As illustrated in FIG. 4, the capacitances of the impedance tuning network 340 may each be varying multiples of a particular capacitance value, C. In the particular illustrated example, the multiples are binary in nature (e.g., C, 2C, 4C, 8C). Thus, each side of the inductor may be configured to be in electrical communication with a capacitance value between 0C and 15C. In certain embodiments, the impedance tuning network 340 may be designed so that a 50 Ohm match exists between the PA 410 and the antenna when the switch of the 8C capacitor is closed on each side of the inductor and the remaining switches are open. The automatic impedance tuner 430 can cause the capacitance value to be increased or decreased in the 0C-15C range on each side of the inductor based on a change in the impedance due, for example, to the environment where the device is located or how the device is being held by a user.

In some embodiments, the automatic impedance tuner 430 may be part of a power amplifier controller, such as the power amplifier controller 761, which is described in more detail with respect to FIG. 7 below. Alternatively, or in addition, the automatic impedance tuner 430 may be part of a power amplifier module, which includes the power amplifier 410.

Example Automatic Impedance Tuning Process

Figure 6:
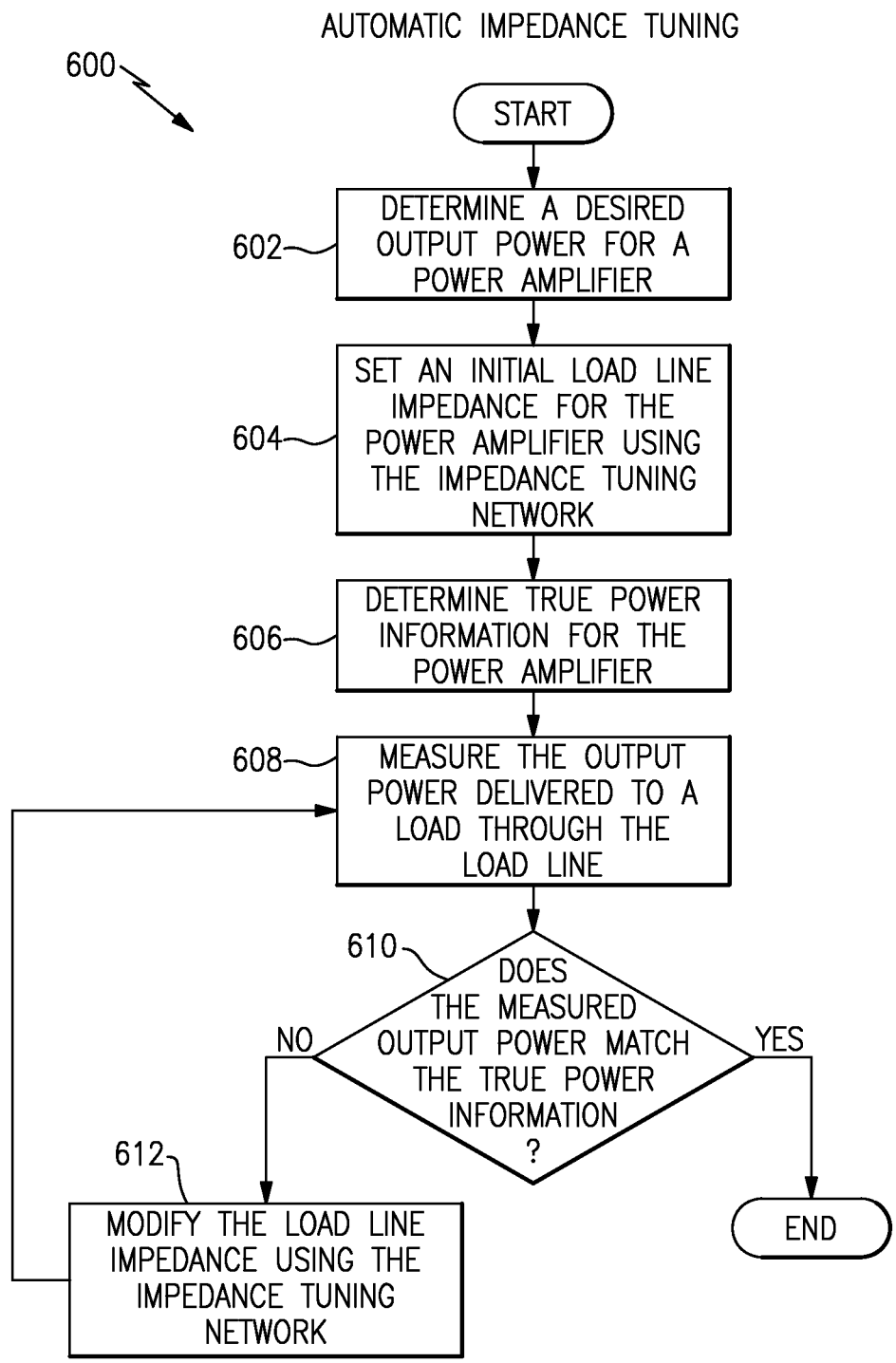

FIG. 6 presents a flowchart of an embodiment of an automatic impedance tuning process 600. The process 600 can be implemented by any system that can determine the impedance of two points within a load line and can modify an impedance matching circuit located between the two points based on a comparison of the impedance at the two points. For example, the process 600 may be performed by an automatic impedance tuner 430, an optimization state machine 434, a capacitor controller 332, an impedance tuning network 340, and a power amplifier controller, to name a few. Although one or more systems may implement the process 400, in whole or in part, to simplify discussion, the process 400 will be described with respect to particular systems.

The process 600 begins at the block 602 where, for example, a power amplifier controller (e.g., the power amplifier controller 761 of FIG. 7) determines a desired output power for a power amplifier 410. The desired output power may be application specific. Further, the desired output power may be based on a distance of the electronic device to another device, such as a cellular network base station.

At the block 604, the automatic impedance tuner 430 using, for example, the capacitor controller 332 sets an initial load line impedance for the power amplifier 410 by configuring one or more switches of the impedance tuning network 340. The initial load line impedance may be 50 Ohms or some other application-specific impedance value. Further, setting the initial load line impedance may include electrically connecting a particular set of capacitors to the inductor of the impedance tuning network 340. For example, the 8C capacitors may be placed in electrical communication with the inductor as an initial configuration for the impedance tuning network 340. In some implementations of the process 600, the block 604 may be omitted. For example, the impedance tuning network 340 may be configured with a default configuration or with a configuration resulting from a previous performance of the process 600.

At the block 606, the automatic impedance tuner 430 determines true power information for the power amplifier 410. The true power information may include a value of a current provided to a collector of a transistor of the PA 410, a voltage applied at a collector of a transistor of the PA 410, and an efficiency associated with the PA 410. Using this information, the automatic impedance tuner 430 can determine an expected output power for the PA 410. Further, in some embodiments, the automatic impedance tuner 430 can obtain the true power information using embodiments of U.S. application Ser. No. 11/899,925, which is incorporated by reference above.

At the block 608, the automatic impedance tuner 430 measures the output power delivered to a load (e.g., an antenna, a transceiver) through the load line that includes the PA 410. In some implementations, the output power may be measured using one or more of the coupler 420 and the detector 422.

The automatic impedance tuner 430 determines at the decision block 610 whether the measured output power matches the true power information. This determination may be made by determining whether the measured output power matches an expected output power that is determined from the true power information. If it is determined that the measured output power satisfies the true power information, the process 600 completes. However, although the process 600 as described ends when the output power satisfies the true power information, it should be understood that the process 600 may be a continuous process. Thus, in some implementations, the process 600 may be repeated continuously, intermittently, or each time a change is detected in an impedance along the load line that includes the PA 410, etc.

If it is determined that the measured output power does not satisfy the true power information, the automatic impedance tuner 430 modifies the load line impedance using the impedance tuning network 340 at block 612. Modifying the load line impedance may include using the capacitor controller 332 to open or close one or more switches of the impedance tuning network 340 to electrically disconnect or connect one or more capacitors between the load line and ground. Further, the automatic impedance tuner 430 may determine which capacitors to connect or disconnect using the optimization state machine 434. For instance, using the optimization state machine 434, the automatic impedance tuner 430 may determine whether to increase the capacitance or decrease the capacitance applied to each end of the inductor of the impedance tuning network 340 based on whether a previous configuration of the impedance tuning network 340 resulted in more or less power than was anticipated from the PA 410.

Example Wireless Device

Figure 7:
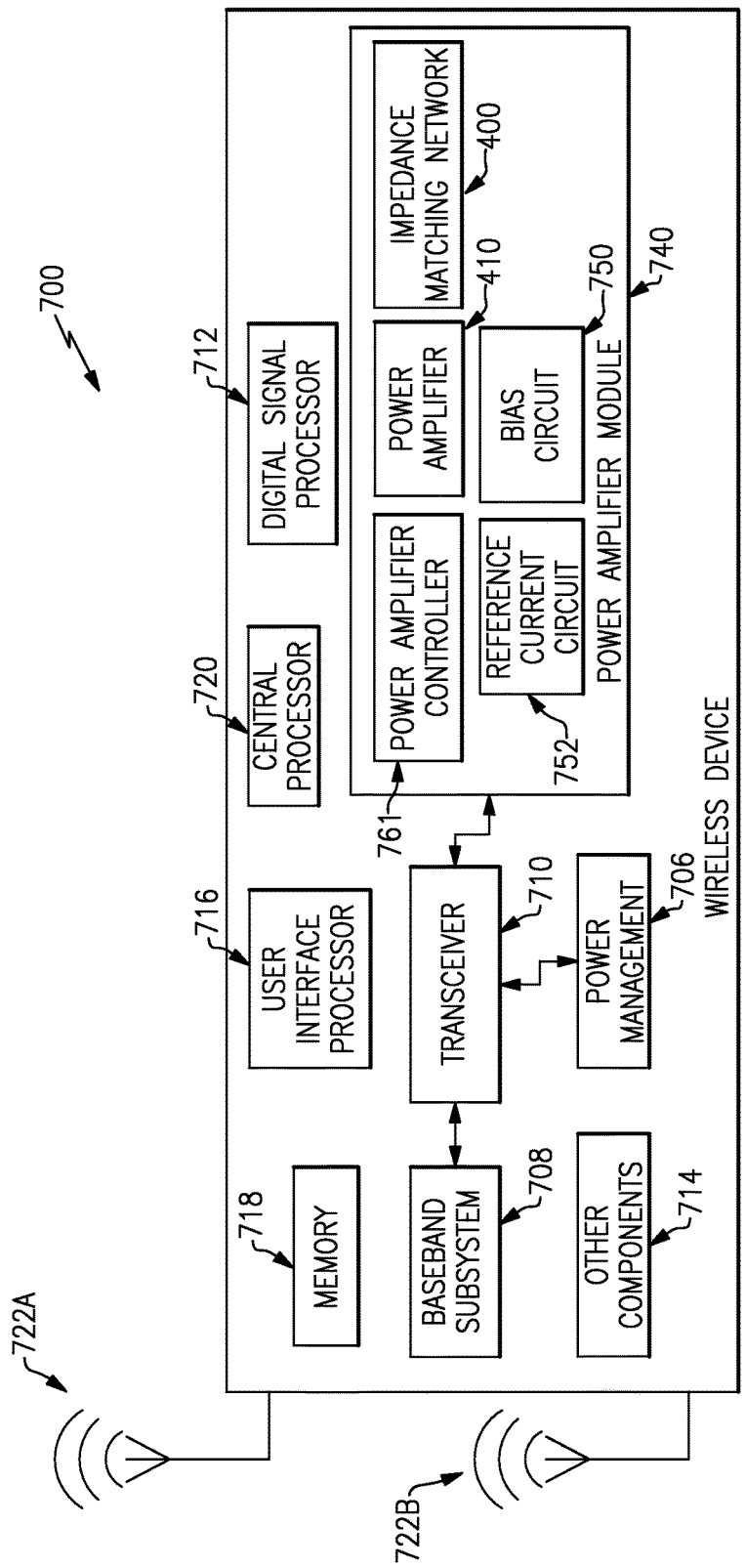

FIG. 7 illustrates a block diagram of a wireless device 700 including a power amplifier module 740. Although the wireless device 700 illustrates only one power amplifier module (PAM), it is possible for the wireless device 700 to include a number of PAMs, each of which may or may not be of the same configuration as PAM 740. Further, the wireless device 700 may include some of or all of the components described with respect to FIG. 4 as part of power amplifier module 740. For example, the PAM 740 may include the impedance tuning network 340 between the PA 410 and an output to the transceiver 710. Further, the automatic impedance tuner 430 may be included as part of the power amplifier controller 761. In some implementations, the impedance matching network 400 may be included as a separate element of the power amplifier module 740. Alternatively, the impedance matching network 400 may be separate from the power amplifier module 740. For instance, the impedance matching network 400 may be electrically connected between the power amplifier module 740 and the transceiver 710.

The power amplifier module 740 can include a number of elements. These elements may include, for example, a power amplifier 410, a power amplifier controller 761, a reference current circuit 752, and a bias circuit 750. Each of these power amplifier module elements may be implemented on the same circuit die. Alternatively, at least some of the elements of the power amplifier module 740 may be implemented on a different element circuit die. Advantageously, by implementing elements on a different circuit die, different semiconductor technologies may be used for different circuit elements of the power amplifier module 740. For example, the bias circuit 750 may be implemented using gallium arsenide (GaAs) technology while the reference current circuit may be implemented using silicon (Si).

The PAM 740 may include a power amplifier controller 761 that may be used to set and/or configure the PA 410 of the PAM 740. Certain implementations of the power amplifier module 740 may omit the power amplifier controller 761. For example, the power amplifier 410 may include the power amplifier controller 761 on-chip or integrated with the power amplifier 410. In some embodiments, the PAM 740 may include multiple PAs, which may share the PA controller 761 or which may each be associated with its own power amplifier controller. The PA 410 can facilitate, for example, multi-band operation of the wireless device 700. The mode of the power amplifier 410 may, in some cases, be set by the power amplifier controller 761 based on a signal and/or mode selection set by the power amplifier module 740 or from a transceiver, etc.

In some embodiments, the power amplifier controller 761 may set the operating point for the PA 410 by modifying the bias circuit 750. For instance, the power amplifier controller 461 may set or modify a bias current provided by the bias circuit 750 to the PA 410.

The power amplifier 410 may include any type of power amplifier. Further, the power amplifier may be set to operate at a particular operating point. This operating point may be configured by the bias circuit 750, which may provide a bias current and/or voltage to the power amplifier 410.

The reference current circuit 752 may be configured to provide a reference current to one or more elements of the power amplifier module 740. For example, the reference current circuit 752 may provide a reference current to the bias circuit 750. Further, the reference current circuit 752 may be implemented separately from the bias circuit 750 and, in some cases, may be implemented using a different semiconductor material and/or process than the bias circuit 750. Alternatively, the reference current circuit 752 may be of the same material as the bias circuit 750. In some such cases, the reference current circuit 752 may be included with the bias circuit 750 as part of a single circuit die.

In some cases, the PAM 740 can receive RF signals from a transceiver 710 that can be configured and operated in known manners to generate RF signals to be amplified and transmitted, and to process received signals. The transceiver 710 is shown to interact with a baseband subsystem 708 that is configured to provide conversion between data and/or voice signals suitable for a user and RF signals suitable for the transceiver 710. The transceiver 710 may also be connected to a power management component 706 that is configured to manage power for the operation of the wireless device. Such power management can also control operations of the baseband sub-system 708 and the PAM 740. It should also be understood that the power management component 706 may include a power supply, such as a battery. Alternatively, or in addition, one or more batteries may be separate components within the wireless device 700.

Other connections between the various components of the wireless device 700 are possible, and are omitted from FIG. 7 for clarity of illustration only and not to limit the disclosure. For example, the power management component 706 may be electrically connected to the baseband subsystem 708, the PAM 740, the DSP 712, or other components 714. As a second example, the baseband subsystem 708 may be connected to a user interface processor 716 that may facilitate input and output of voice and/or data provided to and received from the user. The baseband sub-system 708 can also be connected to a memory 718 that may be configured to store data and/or instructions to facilitate the operation of the wireless device 700, and/or to provide storage of information for the user.

In addition to the aforementioned components, the wireless device may include one or more central processors 720. Each central processor 720 may include one or more processor cores. Further, the wireless device 700 may include one or more antennas 722A, 722B. In some cases, one or more of the antennas of the wireless device 700 may be configured to transmit and receive at different frequencies or within different frequency ranges. Further, one or more of the antennas may be configured to work with different wireless networks. Thus, for example, the antenna 722A may be configured to transmit and receive signals over a 2G network, and the antenna 722B may be configured to transmit and receive signals over a 3G network. In some cases, the antennas 722A and 722B may both be configured to transmit and receive signals over, for example, a 2.5G network, but at different frequencies.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. Further, the wireless device 700 may include any number of additional components, such as analog to digital converters, digital to analog converters, graphics processing units, solid state drives, etc. Moreover, the wireless device 700 can include any type of device that may communicate over one or more wireless networks and that may include a PA 410 and/or PAM 740. For example, the wireless device 400 may be a cellular phone, including a smartphone or a dumbphone, a tablet, a laptop, a video game device, a smart appliance, etc.

Additional Embodiments

In some embodiments, a wireless device 700 can communicate a desired output power to a power amplifier module 740. This may be accomplished by an analog voltage or through a serial port. An optimization state matching 434 may indicate that the impedance tuning network 340 should be initialized to provide a particular impedance for the load line. For example, the impedance may be set to the lowest support impedance value by the impedance tuning network 340, which would correspond to providing the highest output power to the load and the poorest efficiency.

The coupler 420 at the load can measure the output power delivered to the load through the detector 422. The automatic impedance tuner 430 can compare the commanded or requested output power with the measured output power. If the measured output power is too high, the optimization state machine 434 may indicate that the automatic impedance tuner 434 should use the capacitor controller 332 to lower the load line impedance by closing or opening one or more switches of the impedance tuning network 340 resulting in an adjustment of the capacitor values of the circuit.

After raising the load line impedance of the PA 410, the automatic impedance tuner 430 can repeat the process of measuring the output power of the PA 410. If the output power is again too high, the automatic impedance tuner 430 could again raise the load line impedance. Alternatively, if the output power was too low, the automatic impedance tuner 430 could lower the load line impedance.

The automatic impedance tuner 430 can raise and lower the output impedance until the power amplifier 410 delivers the commanded or requested output power with a minimum amount of power consumed by the PA 410 as measured by the true power circuitry. In some cases, the automatic impedance tuner 430 may start at the highest or lowest load line impedance or at a nominal value. Various optimization techniques that are known in the art may be used in iteratively setting the load line impedance to facilitate obtaining the requested output power within a threshold margin during a threshold time period to ensure that a communication link utilized by the wireless device 400 is maintained.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of performing dynamic impedance tuning, the method comprising:
    determining a desired output power for a power amplifier;
    determining true power information for the power amplifier, the true power information including a collector current provided to the power amplifier, a collector voltage applied to the power amplifier, and an efficiency value for the power amplifier;
    measuring an output power delivered to a load by the power amplifier;
    determining whether the output power satisfies the true power information; and
    responsive to determining that the output power does not satisfy the true power information, modifying a load line impedance for the power amplifier using an impedance tuning network.

2. The method of claim 1 wherein determining whether the output power satisfies the true power information includes determining whether the output power is within a threshold value of the true power information.

3. The method of claim 1 further comprising setting an initial load line impedance for the power amplifier using the impedance tuning network.

4. The method of claim 3 wherein setting the initial load line impedance includes selecting an intermediate impedance value for the power amplifier.

5. The method of claim 1 wherein modifying the load line impedance includes closing a set of switches included in the impedance tuning network causing a set of capacitors to be placed in electrical communication with the power amplifier.

6. The method of claim 1 wherein responsive to determining that the output power does not satisfy the true power information, the method further includes determining whether the load line impedance should be increased or decreased.

7. A dynamic impedance matching network comprising:
    an impedance tuning network including an inductor, a first set of capacitors in electrical communication with a first node of the inductor, a second set of capacitors in electrical communication with a second node of the inductor, a first set of switches between the first set of capacitors and a ground, and a second set of switches between the second set of capacitors and the ground;
    a coupler in electrical communication with a first node of the impedance tuning network;
    a detector in electrical communication with the coupler, the combination of the detector and the coupler configured to measure a first power value at the first node of the impedance tuning network; and
    an automatic impedance tuner electrically coupled to the detector and configured to operate the first and second sets of switches based at least in part on the first power value, the automatic impedance tuner including an optimization state machine configured to specify switches from the first set of switches and switches from the second set of switches to operate based at least in part on the first power value.

8. The dynamic impedance matching network of claim 7 wherein the impedance tuning network includes a second node in electrical communication with a power amplifier.

9. The dynamic impedance matching network of claim 8 wherein the second node is directly coupled to the power amplifier.

10. The dynamic impedance matching network of claim 8 wherein the automatic impedance tuner is further configured to obtain true power information for the power amplifier.

11. The dynamic impedance matching network of claim 10 wherein the automatic impedance tuner is further configured to operate the first set of switches and the second set of switches based at least in part on a result of comparing the first power value with the true power information.

12. The dynamic impedance matching network of claim 11 wherein the true power information includes an input power applied to the power amplifier and a gain efficiency for the power amplifier.

13. The dynamic impedance matching network of claim 7 wherein the automatic impedance tuner includes a capacitor controller configured to operate the first set of switches and the second set of switches.

14. A wireless device comprising:
    a power amplifier module including a power amplifier; and
    an impedance matching network including an impedance tuning network, a coupler, a detector, and an automatic impedance tuner, the impedance tuning network including an inductor, a first set of capacitors in electrical communication with a first node of the inductor, a second set of capacitors in electrical communication with a second node of the inductor, a first set of switches between the first set of capacitors and a ground, and a second set of switches between the second set of capacitors and the ground, the coupler being in electrical communication with a first node of the impedance tuning network, the combination of the detector and the coupler configured to measure a first power value at the first node of the impedance tuning network, the automatic impedance tuner being in electrical communication with the detector and configured to operate the first and second sets of switches based at least in part on the first power value, the automatic impedance tuner further configured to obtain true power information for the power amplifier and to operate the first and second sets of switches based at least in part on a result of comparing the first power value with the true power information.

15. The wireless device of claim 14 wherein the impedance tuning network includes a second node in electrical communication with the power amplifier.

16. The wireless device of claim 14 wherein the automatic impedance tuner includes a capacitor controller configured to operate the first set of switches and the second set of switches.

17. A dynamic impedance matching network comprising:
    an impedance tuning network including an inductor, a first set of capacitors in electrical communication with a first node of the inductor, a second set of capacitors in electrical communication with a second node of the inductor, a first set of switches between the first set of capacitors and a ground, and a second set of switches between the second set of capacitors and the ground;
    a coupler in electrical communication with a first node of the impedance tuning network, the impedance tuning network including a second node in electrical communication with a power amplifier;

a detector in electrical communication with the coupler, the combination of the detector and the coupler configured to measure a first power value at the first node of the impedance tuning network; and an automatic impedance tuner electrically coupled to the detector and configured to operate the first and second sets of switches based at least in part on the first power value, the automatic impedance tuner further configured to obtain true power information for the power amplifier, the true power information including a collector current provided to the power amplifier, a collector voltage applied to the power amplifier, and an efficiency value for the power amplifier.

18. A dynamic impedance matching network comprising:

an impedance tuning network including an inductor, a first set of capacitors in electrical communication with a first node of the inductor, a second set of capacitors in electrical communication with a second node of the inductor, a first set of switches between the first set of capacitors and a ground, and a second set of switches between the second set of capacitors and the ground;

a coupler in electrical communication with a first node of the impedance tuning network;

a detector in electrical communication with the coupler, the combination of the detector and the coupler configured to measure a first power value at the first node of the impedance tuning network; and an automatic impedance tuner electrically coupled to the detector and configured to operate the first and second sets of switches based at least in part on the first power value, the automatic impedance tuner further configured to obtain true power information for the power amplifier and to operate the first and second sets of switches based at least in part on a result of comparing the first power value with the true power information.

19. A wireless device comprising:

a power amplifier module including a power amplifier; and an impedance matching network including an impedance tuning network, a coupler, a detector, and an automatic impedance tuner, the impedance tuning network including an inductor, a first set of capacitors in electrical communication with a first node of the inductor, a second set of capacitors in electrical communication with a second node of the inductor, a first set of switches between the first set of capacitors and a ground, and a second set of switches between the second set of capacitors and the ground, the coupler being in electrical communication with a first node of the impedance tuning network, the combination of the detector and the coupler configured to measure a first power value at the first node of the impedance tuning network, the automatic impedance tuner being in electrical communication with the detector and configured to operate the first and second sets of switches based at least in part on the first power value, the automatic impedance tuner further configured to obtain true power information for the power amplifier, the true power information including a collector current provided to the power amplifier, a collector voltage applied to the power amplifier, and an efficiency value for the power amplifier.

20. A wireless device comprising:

a power amplifier module including a power amplifier; and an impedance matching network including an impedance tuning network, a coupler, a detector, and an automatic impedance tuner, the impedance tuning network including an inductor, a first set of capacitors in electrical communication with a first node of the inductor, a second set of capacitors in electrical communication with a second node of the inductor, a first set of switches between the first set of capacitors and a ground, and a second set of switches between the second set of capacitors and the ground, the coupler being in electrical communication with a first node of the impedance tuning network, the combination of the detector and the coupler configured to measure a first power value at the first node of the impedance tuning network, the automatic impedance tuner being in electrical communication with the detector and configured to operate the first and second sets of switches based at least in part on the first power value, the automatic impedance tuner including an optimization state machine configured to specify switches from the first set of switches and switches from the second set of switches to operate based at least in part on the first power value.

* * * * *